(12) United States Patent
Bailey et al.

(10) Patent No.: US 7,260,517 B2
(45) Date of Patent: Aug. 21, 2007

(54) SYNCHRONIZATION OF MULTIPLE SIMULATION DOMAINS IN AN EDA SIMULATION ENVIRONMENT

(76) Inventors: Brian Bailey, 20444 S. Jasan Dr., Oregon City, OR (US) 97045; Devon J. Kehoe, 4940 SW. Joshua Ct., Tualatin, OR (US) 97062; Jeffry A. Jones, 2453 S. Marylhurst Dr., West Linn, OR (US) 97068

( * ) Notice: Subject to any disclaimer, the term of this patent is extended or adjusted under 35 U.S.C. 154(b) by 625 days.

(21) Appl. No.: 09/883,838

(22) Filed: Jun. 17, 2001

(65) Prior Publication Data

US 2003/0191615 A1    Oct. 9, 2003

(51) Int. Cl.
| | |
|---|---|
| G06F 9/455 | (2006.01) |
| G06F 11/00 | (2006.01) |
| G06F 17/50 | (2006.01) |
| G01R 31/28 | (2006.01) |

(52) U.S. Cl. .......................... 703/27; 714/37; 714/725; 716/1

(58) Field of Classification Search ................. 703/19, 703/17; 716/1; 714/37, 725
See application file for complete search history.

(56) References Cited

U.S. PATENT DOCUMENTS

| | | | | |
|---|---|---|---|---|
| 3,903,403 A | * | 9/1975 | Ferguson et al. ............. | 703/18 |
| 5,119,483 A | | 6/1992 | Madden et al. | |
| 5,136,528 A | * | 8/1992 | Fordham et al. ............... | 703/6 |
| 5,327,361 A | | 7/1994 | Long et al. | |
| 5,546,562 A | * | 8/1996 | Patel ............................ | 703/14 |
| 5,742,181 A | * | 4/1998 | Rush ............................ | 326/41 |
| 5,768,567 A | * | 6/1998 | Klein et al. .................... | 703/13 |
| 5,771,370 A | | 6/1998 | Klein | |
| 5,872,953 A | | 2/1999 | Bailey | |
| 5,960,188 A | | 9/1999 | Linke et al. | |
| 5,966,537 A | | 10/1999 | Ravichandran | |
| 5,995,736 A | | 11/1999 | Aleksic et al. | |
| 6,178,542 B1 | | 1/2001 | Dave | |
| 6,182,258 B1 | * | 1/2001 | Hollander ................... | 714/739 |
| 6,208,954 B1 | | 3/2001 | Houtchens | |
| 6,223,144 B1 | * | 4/2001 | Barnett et al. ................ | 703/22 |
| 6,356,862 B2 | * | 3/2002 | Bailey .......................... | 703/16 |
| 6,678,645 B1 | * | 1/2004 | Rajsuman et al. ............ | 703/20 |
| 6,691,301 B2 | | 2/2004 | Bowen | |
| 6,721,922 B1 | * | 4/2004 | Walters et al. ................. | 716/1 |

(Continued)

FOREIGN PATENT DOCUMENTS

EP    0418980    3/1991

(Continued)

OTHER PUBLICATIONS

Leef et al., "Overview of Unified Simulation Activity at Mentor Graphics Corporation" Mentor Graphis 1992 p. 997-1001.*

(Continued)

*Primary Examiner*—Anthony Knight
*Assistant Examiner*—Thomas Stevens
(74) *Attorney, Agent, or Firm*—Klarquist Sparkman LLP

(57) ABSTRACT

A simulation environment includes a number of simulation domains. Particular simulation domains in a simulation environment are selectively activated and deactivated such that performance and resolution for a circuit design being simulated are dynamically controlled.

40 Claims, 3 Drawing Sheets

U.S. PATENT DOCUMENTS

| | | |
|---|---|---|
| 6,810,373 B1 | 10/2004 | Harmon et al. |
| 6,820,047 B1 | 11/2004 | Aizawa et al. |
| 6,820,243 B1 | 11/2004 | Shey et al. |
| 6,983,237 B2 | 1/2006 | Paterson et al. |

FOREIGN PATENT DOCUMENTS

| | | |
|---|---|---|
| EP | 0418980 A2 | 9/1991 |

OTHER PUBLICATIONS

Odryan et al., "A Workstation-Based Mixed Mode Circuit Simulator" IEEE 1986, 186-192.*

Pramataris et al., "Hardware/Software Co-Simulation Methodology based on Two Alternative Approaches" IEEE 1999. p. 63-66.*

Time Executable System Specification of an ADSL Moddem Using C++ based Design Environment: A Case Study. ACM 1999. p. 38-42.*

Yoo et al., "Fast Hardware-Software Coverification by Optimistic Execution of Real Processor", Proceedings Design, Automation and Test in Europe Conference and Exhibition 2000 (Cat. No. PR00537), Proceedings of Meeting on Design Automation and Test in Europe, Paris, France, Mar. 27-30, 2000, pp. 663-668, XP002258737, 2000, Los Alamitos, CA, USA, IEEE Comput. Soc., USA.

Shah et al., "Target Processor and Co-Verification Environment Independent Adapter—A Technology to Shorten Cycle-Time for Retargeting TI Processor Simulators in HW/SW Co-Verification Environments", ASIC/SOC Conference, 1999. Proceedings. Twelfth Annual IEEE International, Washington, D.C. USA Sep. 15-18, 1999, Piscataway, NJ, USA, IEEE, US, Sep. 15, 1999, pp. 37-41, XP010360279.

Harris et al., "The Co-Verification of an RTOS in an SOC", Integrated System Design, May 2001, CMP Media, Inc., USA, vol. 13, No. 143, pp. 23-30, XP008023502.

Bailey, B., "Today's Problem—a real example" PowerPOint presentation, 1997 Mentor Graphics, p. 1-6.

Liao et al., "Towards a New Standard for System-Level Design" IEEE, p. 2-6, May 2000.

Opdahl et al., "Towards an Integrated, Simulative Framework for Real-World Modelling", 1996, pp. 515-524.

Bailey et al., "Hardware/Software Co-Simulation Strategies for the Future", Feb. 2000 Mentor Graphics Corporation, pp. 1-9.

* cited by examiner

SYNCHRONIZATION OF MULTIPLE SIMULATION DOMAINS IN AN EDA SIMULATION ENVIRONMENT

FIELD OF THE INVENTION

The present invention pertains to the field of electronic design automation (EDA). More particularly, this invention relates to synchronizing multiple simulation domains within an EDA simulation environment.

BACKGROUND OF THE INVENTION

Electronic design automation (EDA) has long been used to design and verify electronic hardware such as integrated circuits. Increasingly, however, new circuit designs have both a hardware component and a software component. For instance, an "embedded" system often includes a special-purpose hardware component that is installed in a general-purpose host computer system. A software component is developed to execute on one or more processors in the host system to allow the host system to interact with the installed hardware component.

One familiar example of an embedded system is a "software" modem. A software modem uses the software processing power of a host computer system to process data traffic. A software modem only needs enough special-purpose hardware to pass data back and forth between the computer system's processor and a telephone network. As with most embedded systems, the special-purpose hardware in a software modem is significantly less complicated than the hardware of a typical hardware modem. Simplifying the hardware usually results in smaller components and a lower price point, which is one reason hardware/software circuit designs are so popular.

Although there are numerous advantages to embedded circuit designs, designing the hardware and software components of these circuit designs to work together is no trivial matter. Ideally, a hardware/software system is simulated and verified before a physical prototype is produced. A logic simulator works well for simulating hardware, but does not work well for simulating software execution in hardware. Under most circumstances, even the fastest logic simulators can only simulate execution of a few software instructions every second. Given that a processor may execute hundreds of thousands, or even millions, of instructions per second, simulating software execution using a logic simulator is often simply too slow to be useful.

One solution to designing combined hardware/software systems is co-simulation. In co-simulation, the software component of the design is executed in a software execution domain. The software execution domain simulates execution of the software by the host computer system. Often times, software can be simulated at or near the desired execution speed of the host computer system.

With the software component being simulated in the software execution domain, only the hardware component of the design needs to be simulated in a logic simulator domain. In co-simulation, the two simulation domains are used together to model, or co-simulate, the entire hardware/software circuit design, including the interaction between the software and hardware components, as if the circuit design were embedded in a host system. Of course, the two simulation domains are generally very different. Using multiple simulation domains to efficiently simulate a circuit design presents a number of challenges.

BRIEF DESCRIPTION OF THE DRAWINGS

Examples of the present invention are illustrated in the accompanying drawings. The accompanying drawings, however, do not limit the scope of the present invention. Similar references in the drawings indicate similar elements.

DETAILED DESCRIPTION

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

Various operations will be described as multiple discrete steps performed in turn in a manner that is helpful in understanding the present invention. However, the order of description should not be construed as to imply that these operations are necessarily performed in the order they are presented, nor even order dependent. Lastly, repeated usage of the phrase "in one embodiment" does not necessarily refer to the same embodiment, although it may.

A related application, "Coherent State Among Multiple Simulation Models in an EDA Simulation Environment," was filed contemporaneously on Jun. 17, 2001, having application No. XX/XXX,XXX [51005.P220].

Two related inventions are described herein but are claimed separately here and in the above referenced application. One invention selectively activates certain simulation domains in an electronic design automation (EDA) simulation environment at various times during the simulation of a circuit design and maintains timing synchronization among the various domains. The other invention makes state information accessible to simulation models in an EDA simulation environment without the necessity of simulating data transfers in the simulated circuit design. In various embodiments, the inventions increase efficiency and versatility of a simulation environment.

Figure 1:
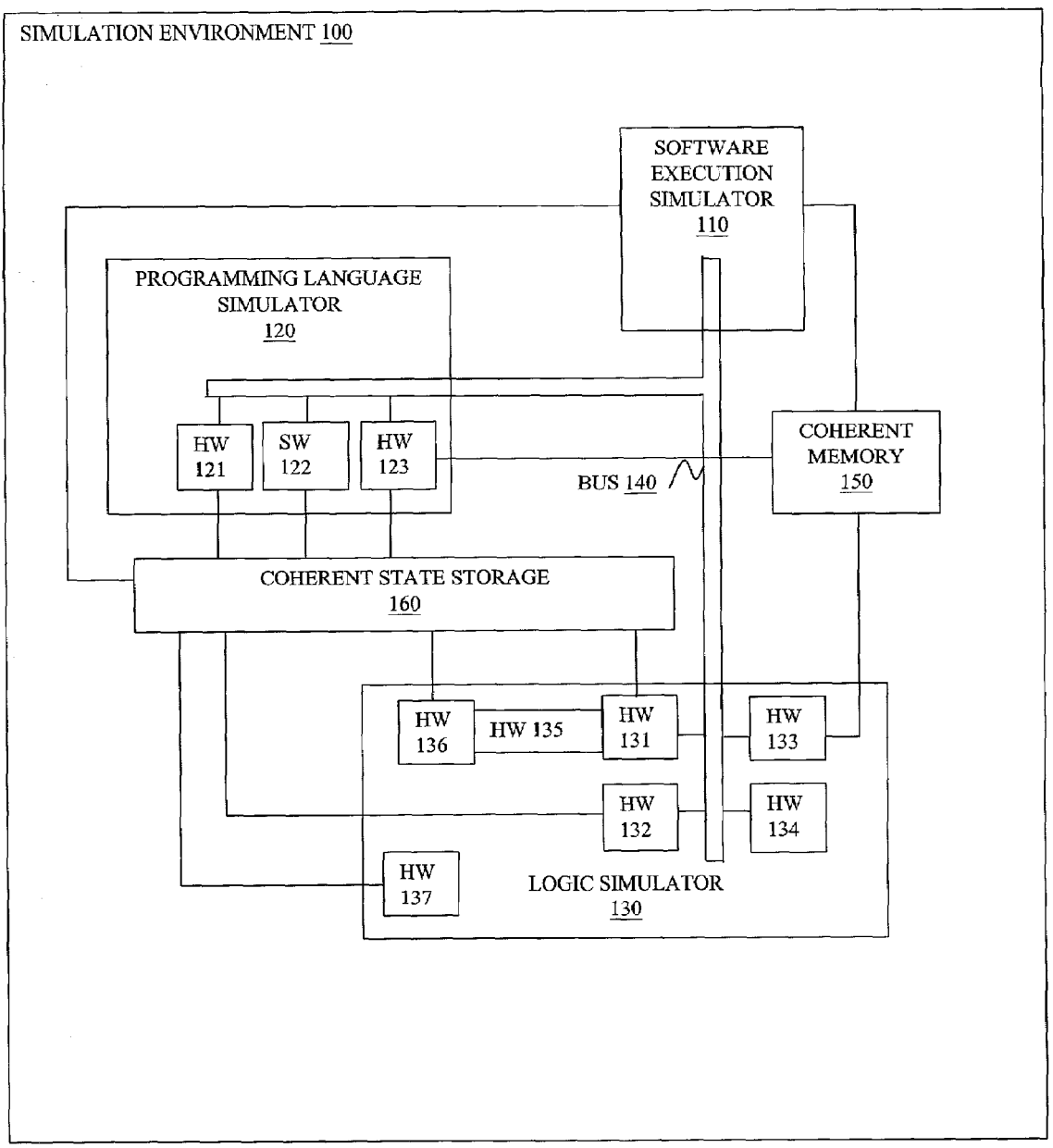
FIG. 1 illustrates one embodiment of a hardware/software co-simulation environment according to the teachings of the present invention.

FIG. 1 illustrates one embodiment of a hardware/software co-simulation environment 100 according to the teachings of the present invention. Simulation environment 100 includes a software execution simulator 110, a programming language simulator 120, and a logic simulator 130 all coupled together by a bus model 140. The three simulators interact through the bus model 140 to simulate a circuit design. Bus model 140 simulates any collection of signals over which data is transferred using a protocol in the circuit design.

Different parts of the circuit design may be simulated by each of the three simulators. For instance, in the illustrated embodiment, the circuit design includes a software component and a hardware component. Execution of the software is simulated by software simulator 110. Various parts of the hardware component are simulated by the two hardware simulators, programming language simulator 120 and logic simulator 130. Programming language simulator 120 may also be used in other cases for the execution of software components, or for the execution of components that have not yet been mapped to either hardware or software. Bus model 140 models the particular bus protocol used by the target system for transactions among the components in the simulated circuit design.

Software execution simulator 110, programming language simulator 120, and logic simulator 130 each represent any of a number of simulators known in the art. For instance, software simulator 110 may include one or more instruction set simulators (ISS), native processor packages, etc., to model execution of software. Logic simulator 130 may include one or more simulators based on hardware description languages (HDL), gate-level simulators, programmable hardware emulators, etc., to model hardware components. Similarly, programming language simulator 120 may include simulators written in any of a number of programming languages, such as C, C++, or Java.

Except for the teachings of the present inventions, simulation environment 100 is intended to represent a broad category of simulation environments known in the art. Alternate embodiments may include additional simulators, may not include all of the illustrated simulators, and may include simulators organized in any variety of architectures. For instance, alternate embodiments may not include the software simulator 110, or may simulate a more complex bus architecture such as an architecture including multiple software simulators to simulate parallel processors as well as bus bridges to additional buses simulated by additional hardware simulators. Furthermore, any number of communication protocols can be used within simulation environment 100 to simulate the interaction among the various simulators.

Synchronization of Multiple Simulation Domains

A software simulator, such as software simulator 110, can usually simulate software execution at or near the operating frequency of the target system. For instance, if the target system for a particular circuit design is a personal computer, the system clock in the personal computer is likely to operate at several hundred megahertz. In which case, the software simulator that uses the native processor is likely to simulate several million clocks cycles per second. A software simulator that uses an instruction set simulator is likely to simulate clock cycles in the 10 kilohertz range.

A logic simulator, such as logic simulator 130, can provide highly detailed resolution of a hardware simulation, but it is much slower than the software simulator. A logic simulator may only be able to simulate a few clock cycles per second. A programming language simulator, such as programming language simulator 120, is likely to simulate clock cycles at between 10 hertz and 10 kilohertz.

Under normal circumstances, in order for the software simulator to synchronize interactions with either the logic simulator or programming language simulator, the software simulator must operate at the same, slower speed of the respective hardware simulator.

Fortunately, as software is executed by a processor in a typical hardware/software design, other than memory accesses, the processor interacts with other hardware at a comparatively low frequency. That is, a processor may execute several thousand clock cycles between interactions with hardware other than memory. This hardware is likely to sit idle much of the time between such interactions.

A hardware/software co-simulator takes advantage of this situation. Rather than running the entire simulation at the slow rate of the logic simulator or the programming language simulator, the simulation only needs to run at the slower simulation speed when the slower simulator is active. The rest of the time, the simulation can operate at the much faster speed of the software simulator, greatly increasing simulation efficiency. Timing synchronization between the two simulators is maintained by essentially skipping the simulation of idle clock cycles in the slower simulators.

The present invention expands upon this principle. The present invention allows for multiple simulators in the simulation environment, and synchronizes timing among them. A circuit design is divided into multiple simulation domains, where each simulation domain contains at least one simulation model. Each simulation domain can be selectively activated or deactivated. In one embodiment, each domain provides a particular level of performance and simulation detail or resolution. In which case, by selecting particular combinations of domains, the present invention can alternately increase the speed or resolution of various stages of simulation.

In one embodiment, each domain has its own notion of time. That is, multiple domains can operate at the same time and at different operating frequencies. Operating frequencies between two domains only need to correlate when simulating interactions between the two domains.

For example, assume that the circuit design illustrated in FIG. 1 performs video input analysis. There are several different aspects to the circuit design. First, there is a hardware input interface that samples video input at regular intervals. For instance, 30 times per second, the hardware interface loads one image worth of data in memory in a burst. Second, the raw input data is compressed in hardware, and third, the compressed data is analyzed in software.

The software portion is, of course, modeled by the software simulator 110. High level C++ simulation models are used to simulate the hardware data compression because, for instance, no detailed models have been developed yet, or the designer simply does not need a detailed simulation of the data compression. In which case, the data compression hardware is modeled in the programming language simulator 120. On the other hand, detailed HDL models have been created for the hardware input interface, so the hardware interface is modeled in the logic simulator 130.

The detailed model in the logic simulator has the slowest simulation speed. Fortunately, the hardware interface only operates briefly and at regular intervals. Between bursts of input, the hardware interface does nothing but wait. Even when the hardware is idle, simulating it takes a great deal of simulation time. In which case, the hardware interface has its own simulation domain so the simulation environment can deactivate it when the hardware is idle. That is, the simulation environment only needs to run at the slow speed of the logic simulator when the hardware interface domain is active.

The C++ models operate at a higher abstraction level, so they run much faster than the detailed HDL models. Assuming the C++ models run as fast as the software execution simulator, both the C++ models and the software execution could be placed in the same domain and activated together. If the C++ models are not as fast, the C++ models and the software execution may be in separate domains so the software execution can run faster when the C++ models are not active.

Similarly, even if the C++ models and the software execution are comparably fast, if the C++ models are functionally independent from the software execution, they may have separate domains. For instance, if the software execution merely waits for the C++ models to finish compressing the data before analyzing the data, having separate domains allows the software execution to be deactivated for any number of reasons while the C++ models are active.

In other words, several different criteria can be used for partitioning a circuit design into simulation domains. For instance, a circuit design can be partitioned based on simulation type, abstraction level, function type, or any combination thereof. Partitioning the circuit design of FIG. 1 based on simulation type could result in a software execution domain for the software model in software simulator 110 and two hardware simulation domains, one domain including the hardware models, 121 to 123, in programming language simulator 120 and another domain including the hardware models, 131 to 137, in logic simulator 130.

When partitioning by abstraction level, abstraction levels can be thought of, in one embodiment, in terms of the granularity of data operations modeled by a particular simulation model. For instance, if a model simulates operations on individual bits of data, the model is said to be at the pin-level of abstraction. If a model simulates operations on data words, where a data word is the atomic unit of data carried by the bus model, the model is said to be at the bus level of abstraction. If a model simulates operations on transactions, the model is said to be at the transaction level of abstraction.

The transaction level is less easily defined than the other two levels of abstraction. A transaction may be, for instance, a read operation that reads a block of data. If the block of data is larger than a single word of data, the transaction would require multiple bus operations at the bus level. Each word would be transferred one at a time over the bus until the entire block is read. Reading the block of data at the pin level may involve hundreds or thousands of individual data operations as each bit of data is received and simulated. The pin level is, of course, the most detailed level of abstraction. The pin level also has the slowest simulation time. The bus level is less detailed, but faster. The transaction level is even less detailed than the bus level, and is even faster.

That is, at the transaction level, a simulation model is not concerned with simulating the details of how a block of data in the physical circuit is divided into several data word operations or thousands of individual bit operations. Rather, a transaction level model is just concerned with reading the block of data in one transaction. The way in which a transaction level model transfers data in a simulation environment without simulating bus operations or pin operations is discussed below with respect to coherent state.

Programming language simulations tend to operate at the higher levels of abstraction, although pin level programming language simulation is possible. Logic simulations tend to operate at the lower levels of abstraction, although bus and transaction level logic simulation are possible. For instance, an HDL-based logic simulator can simulate behavioral models at higher levels of abstraction. Software execution simulations tend to simulate at the bus level, but transaction level simulations are possible. In which case, as a practical matter, abstraction-level partitioning is likely to result in much the same group of domains as simulation-type partitioning due to the typical abstraction levels simulated in each type of simulator.

Partitioning by function type is likely to provide the greatest flexibility. Any simulation model that is sufficiently independent from the rest of the circuit design can be in a separate domain. Obviously, as discussed above, software execution is likely to operate independently from the rest of the simulation a majority of the time. In which case, software execution simulation is a good candidate for its own domain.

Among hardware models, however, the relative independence of different pieces of hardware is likely to depend a great deal on the nature of the circuit design. In which case, separating hardware models into functional domains can be performed in any number of ways during, for instance, the design process. In many circumstances, separating hardware into relatively independent blocks is a natural part of the design process. For instance, in the embodiment of FIG. 1, the designer broke the hardware of the circuit design into ten different hardware models, 121 to 123 and 131 to 137, probably because the functionality of each hardware model was relatively independent from the rest of the design and creating separate models for each simplified the design process. In which case, each of the ten hardware models could define its own functional domain.

Alternately, certain groups of hardware models may be closely related in terms of functionality. For instance, in the illustrated embodiment, hardware models 131, 135, and 136 may frequently operate in unison. In which case, the three hardware models could be included in one simulation domain.

A simulation model may also belong to multiple simulation domains. For instance, the hardware models 131, 135, and 136 may have separate domains so they can be individually activated, but they may also be part of a larger simulation domain so that they can all be activated in unison. Using such a hierarchical structure of domains, various sets of domains can be activated according to levels of the hierarchy.

Domains can also span simulators. For instance, if hardware model 121 in programming language simulator 120 is functionally related to, or is modeled at the same abstraction level as, hardware model 132 in logic simulator 130, the two hardware models can be in the same simulation domain.

Once a circuit design has been separated into domains, the simulation environment needs to control which of the different domains is active at any given time. In general, domains are controlled based on the state of the circuit design by selectively advancing simulation time only in activated simulation domains. Several different control mechanisms can be used. For instance, the simulation environment could use a centralized control, a transaction-based control, a distributed control, or any combination thereof.

In one embodiment of centralized control, the simulation environment receives state information from each of the simulation domains. The centralized control consults system configuration information for each system state to determine which of the simulation domains should be active. Then, the centralized control instructs a centralized simulation clock to advance only for those domains that should be active.

In one embodiment, the state information comprises addresses within the circuit design. That is, the centralized control determines which domains to activate depending upon which addresses are being accessed. For example, when software simulator 110 places an address on bus 140, the centralized control reads that address and knows from the configuration information that the address corresponds to hardware modeled in, for instance, a simulation domain comprising the programming language simulator 120. In which case, the centralized control instructs the system clock to advance in that domain.

In one embodiment of transaction-based control, the state information comprises individual data transactions. A transaction is configured with information identifying which of the simulation domains should be active for simulating the data transaction. As part of the transaction, a message is sent to the simulation environment that instructions the simulation environment with respect to which domains are to be advanced.

For example, a particular data transaction involves two pieces of hardware in the physical circuit. The first piece of hardware and the second piece of hardware are both connected to the system's data bus. The first piece of hardware is also hardwired to an interrupt input on the second piece of hardware. When the first piece of hardware begins processing the data transaction, it simultaneously sends an interrupt signal directly to the interrupt input on the second piece of hardware. In response to the interrupt, the second piece of hardware begins performing operations in preparation for receiving data from the first piece of hardware.

In the simulation environment, two hardware models simulate the two pieces of hardware. The hardware models are bus-level models, and are incapable of simulating the hardwired connection. The hardware models are also located in separate simulation domains. When the first hardware model begins processing the data transaction, information in the data transaction indicates that the second hardware model should also be active so that it can prepare to receive data from the first model. A message is sent to the simulation environment to activate the second hardware model.

In one embodiment of distributed control, simulation domains include their own clock and their own configuration information. State information is broadcast to the simulation domains and the simulation domains consult their configuration information to determine for themselves if they should be active. For instance, where the state information comprises system addresses, the simulation domains can simply monitor the system bus for addresses.

In each of the control mechanisms, the configuration information can come from any number of sources. For instance, a designer may create the relationships between system states and domains as the design is created and partitioned. In addition to indicating which domains are to be active, the configuration information can also define some terminating event for each activation. For instance, a domain can be configured to run for a particular number of clock cycles whenever a particular system address is active. Alternately, for combinational logic with no clocked components, a domain can be configured to remain active until some result is generated whenever a particular system address is active.

The control mechanisms can be used together. For instance, centralized control may be the default, but transaction-based or distributed control may have priority over centralized control when there is a conflict. For instance, in the example discussed above for the transaction-based control, the centralized control did not activate the second hardware model, but the configuration information in the transaction had priority over the centralized control and caused the second hardware model to be activated.

Coherent State Among Simulation Models

In a simulation environment, such as simulation environment 100 in FIG. 1, each of the simulators is connected by a bus model, such as bus model 140. The bus model contains a detailed pin-level model of the bus used in the target system as well as a protocol engine to model the bus protocol using the target system. The detailed, pin-level model is used to simulate bus transactions with other pin-level models. The pin-level simulation tends to be quite slow.

For instance, in the embodiment of FIG. 1, hardware model 133 in logic simulator 130 simulates system memory. Software simulation 110 is likely to access system memory more often than any other hardware component. To simulate a memory transaction, the software simulator 110 has to slow down to the speed of the pin-level bus model 140. The pin-level bus model then has to interact with hardware model 133 to access the system memory.

Once this path to system memory has been sufficiently simulated and tested, there is no need continue simulating it. That is, there is no need to continue to slow down the software simulator for the countless identical memory transactions that are likely to occur during continued execution of the software. In which case, the simulation environment increases the efficiency of the simulation by bypassing the simulated pin-level path, and instead using only the protocol engine of the bus model to directly access coherent memory 150. In some cases, the protocol engine may be built into the simulation environment. In other cases, an abstract model of the bus may be substituted. For instance, in the embodiment in FIG. 1, the model 123 in programming language simulator 120 may contain the bus protocol engine and it may access the system memory in the same way as detailed hardware model 133. This enables an intermediate level of resolution to be simulated at a correspondingly higher simulation speed.

Coherent memory 150 gives software simulator 110 the option to use a fast path, or back door, to access the simulated system memory. That is, software simulator 110 can make a call directly to the simulation environment and access the simulated system memory directly.

Conversely, hardware model 133 and abstract model 123, rather than modeling the entire system memory, merely models the system memory's interface. The memory interface similarly has access to the simulated system memory through coherent memory 150 by making calls to the simulation environment. Any number of communication protocols can be used to communicate between the simulation models and the simulation environment.

The present invention expands upon this "fast path" principle. The present invention provides coherent state, such as coherent state storage 160 in the embodiment of FIG. 1, to transfer state information among simulation models without actually simulating the transfers. In the illustrated embodiment, the software simulation model in software simulator 110, as well as hardware models 121, 122, 123, 131, 132, 135, 136, and 137 all have access to coherent state storage 160. In alternate embodiments, any combination of simulation models, up to and including all simulation models in a simulation environment, may have access to coherent state storage.

In one embodiment for example, simulation model 131 wants to transfer state information to simulation model 136. Rather than simulating the transfer through simulation model 135, the state information is stored to a particular state space in coherent state storage 160. Then, as long as hardware model 136 knows where and how to look for the state information in coherent state storage 160, the state information is readily available.

The coherent state storage is part of the simulation environment and particular locations and state configurations in the coherent state storage correspond to particular simulation models in the simulation environment. The coherent state storage itself, however, has no corresponding element in the physical circuit being simulated. That is, the coherent state storage is not part of the circuit design being simulated. Rather, each location and state configuration essentially comprise high-level models of particular elements in the circuit design. Any simulation model that can make calls to the simulation environment can have access to the coherent state storage. Any simulation model with access to the coherent state storage can exchange state information with any other simulation model as long as both models recognize the same state space and state configuration in the coherent state storage.

In one embodiment, the coherent state storage is a centralized memory. In another embodiment, the coherent state storage is distributed.

Sharing state information through coherent state storage is usually much faster than simulating data transfers in the circuit design. Alternately, where a simulation model does not exist for a particular data path in the circuit design, the coherent storage can be used as a "virtual" simulation model. Of course, the coherent storage does not provide the same level of resolution that a simulation model can provide. That is, a simulation model can model pin level timing, noise, and other aspects of circuit operation that are not modeled when state information is transferred through coherent storage. It is, however, possible to attach high level attributes to operations into or out of the coherent state storage, such as approximate timing, estimated power usage etc.

For example, in FIG. 1, logic simulator 130 includes hardware models 131, 135, and 136 coupled as shown. In one embodiment, hardware model 136 models a peripheral device. Hardware model 135 models a USB bus to connect the peripheral to another hardware component, modeled by hardware model 131, that is connected to the system bus 140. The USB bus protocol is quite complex and cumbersome to simulate. After simulating a certain number of data transfers, the USB design is sufficiently tested. From that point on, there is no need to simulate further USB transfers at the level of resolution, and the slow speed, of hardware model 135. In which case, hardware model 136 writes any additional data transfer information to a location in coherent state storage 160 corresponding to hardware model 131. At the other end of the USB bus, hardware model 131 becomes aware of the new state information in coherent state storage 160 and loads it, bypassing the USB model.

As another example, hardware element 137 represents another peripheral device in the circuit design. No simulation model has been created yet to model data transactions with hardware model 137. Hardware model 137, however, has access to coherent state storage 160 and is aware of a location and stage configuration in coherent state storage corresponding to hardware component 123 in programming language simulator 120. In which case, the peripheral simulated by hardware element 137 can transfer data to hardware element 123. And, assuming hardware element 137 is aware of a location and configuration in coherent state storage 160 corresponding to itself, any other simulation model in the simulation environment that is also aware of the location and configuration can transfer data to hardware element 137.

In one embodiment, a simulation model actively monitors the corresponding location in coherent state storage for new state information or checks the location before beginning operation each time the model's domain is activated. In another embodiment, the simulation environment writes the state information to the model before activating its domain. In alternate embodiments, any number of communication protocols can be used to facilitate transfers through the coherent state storage.

Synchronization and Coherent State

Selective activation of simulation domains and coherent state work closely with one another. For instance, in the example discussed above in which hardware model 135 simulates a USB bus, when coherent storage is used to transfer the state information rather than hardware model 135, a simulation domain for hardware model 135 can be deactivated. By deactivating the domain, the domain or domains for hardware models 136 and 131 may be able to operate at a much faster simulation speed than the speed of the USB simulation.

Model Switching

As another example of an application of selective domain activation, two simulation models can represent the same circuit functionality, but at different abstraction levels having different simulation speeds and levels of resolution. Each simulation model is in a different simulation domain. At different stages of simulation, the simulation environment activates one or the other of the two simulation domains depending on the level of speed and resolution desired. When the simulation switches from one simulation model to the other, the deactivated model transfers its state information to the activated model through the simulation environment to provide seamless simulation of the functionality.

Similarly, a particular functionality in the circuit design could be modeled at several levels of abstraction and state information could be transferred among the models as different ones are activated and deactivated.

Transferring state information from one simulation model to another, functionally equivalent simulation model representing the same circuit element may at first appear to be very similar to the state transfers through coherent memory storage discussed above. Coherent state storage, however, basically provides high level simulation models of elements in the circuit design. That is, locations and state configurations in the coherent state storage correspond to actual elements in the physical circuit being simulated. Transferring data using coherent state storage simulates actual data transfers in the physical circuit design.

In contrast, when two functionally equivalent simulation models of one circuit element are available in the simulation environment, the physical circuit contains no functional elements corresponding to the mechanism for transferring the state information from one model to the other because both models represent the same circuit element. That is, transferring state information between functionally equivalent models of the same circuit element is entirely a function of the simulation environment and has no functional equivalent in the physical circuit design being simulated. The state information can be transferred from one functionally equivalent model to another through the fabric of the simulation environment according to any number of communication protocols.

In one embodiment, switching between models can only take place when the state of the first model is available for the simulation environment to read. For instance, the simulation environment may only have access to certain input/output ports and/or registers within the first model. If the states of the accessible ports and registers are not stable, the simulation environment will continue to advance the first model's domain until the states can be read. Then the simulation environment will deactivate the first model's domain, read the state information, write the state information to the second model, and activate the second model's domain.

One example of a circuit element for which model switch can be useful is a bus arbiter. In a circuit design having multiple bus masters, the bus arbiter determines which bus master controls the system bus at any instant in time. If the arbiter is simulated using a slow, pin-level simulator, any time the slow simulator is deactivated to allow for higher speed simulation, the arbitration function will be deactivated. In which case, the simulation environment could include a functionally equivalent, faster simulation model to arbitrate access to the bus when the pin-level simulator is inactive. Each time the simulation environment switches between arbiter models, the simulation environment transfers state information so that, for instance, the newly activated arbiter model knows which bus master currently has control of the bus and for how long, which other bus masters have requested control of the bus and in what order, etc.

Those skilled in the art will also recognize that any number of known interface protocols can be used to format the various requests and responses described above, and to form the various communications channels among the simulation models. Furthermore, those skilled in the art will recognize that one or more of the functions described above may be performed by various components or combinations of components within a simulator environment, and need not be limited to the described examples.

Figure 2:
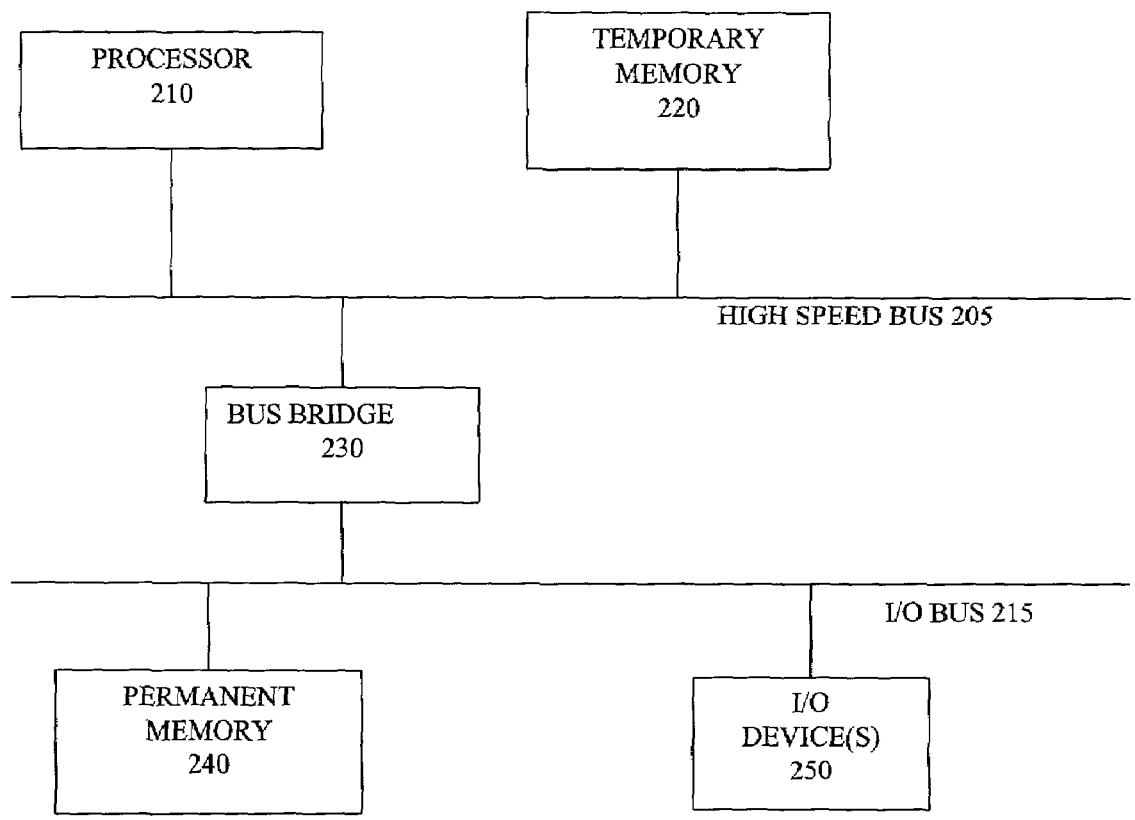
FIG. 2 illustrates one embodiment of a hardware system to implement a multi-domain simulation environment.

FIG. 2 illustrates one embodiment of a hardware system intended to represent a broad category of computer systems such as personal computers, workstations, and/or embedded systems. In the illustrated embodiment, the hardware system includes processor 210 coupled to high speed bus 205, which is coupled to input/output (I/O) bus 215 through bus bridge 230. Temporary memory 220 is coupled to bus 205. Permanent memory 240 is coupled to bus 215. I/O device(s) 250 is also coupled to bus 215. I/O device(s) 250 may include a display device, a keyboard, one or more external network interfaces, etc.

Certain embodiments may include additional components, may not require all of the above components, or may combine one or more components. For instance, temporary memory 220 may be on-chip with processor 210. Alternately, permanent memory 240 may be eliminated and temporary memory 220 may be replaced with an electrically erasable programmable read only memory (EEPROM), wherein software routines are executed in place from the EEPROM. Some implementations may employ a single bus, to which all of the components are coupled, or one or more additional buses and bus bridges to which various additional components can be coupled. Those skilled in the art will be familiar with a variety of alternate internal networks including, for instance, an internal network based on a high speed system bus with a memory controller hub and an I/O controller hub. Additional components may include additional processors, a CD ROM drive, additional memories, and other peripheral components known in the art.

In one embodiment, the present invention, as described above, is implemented using one or more hardware systems such as the hardware system of FIG. 2. Where more than one computer is used, the systems can be coupled to communicate over an external network, such as a local area network (LAN), an internet protocol (IP) network, etc. In one embodiment, the present invention is implemented as software routines executed by one or more execution units within the computer(s). For a given computer, the software routines can be stored on a storage device, such as permanent memory 240.

Figure 3:
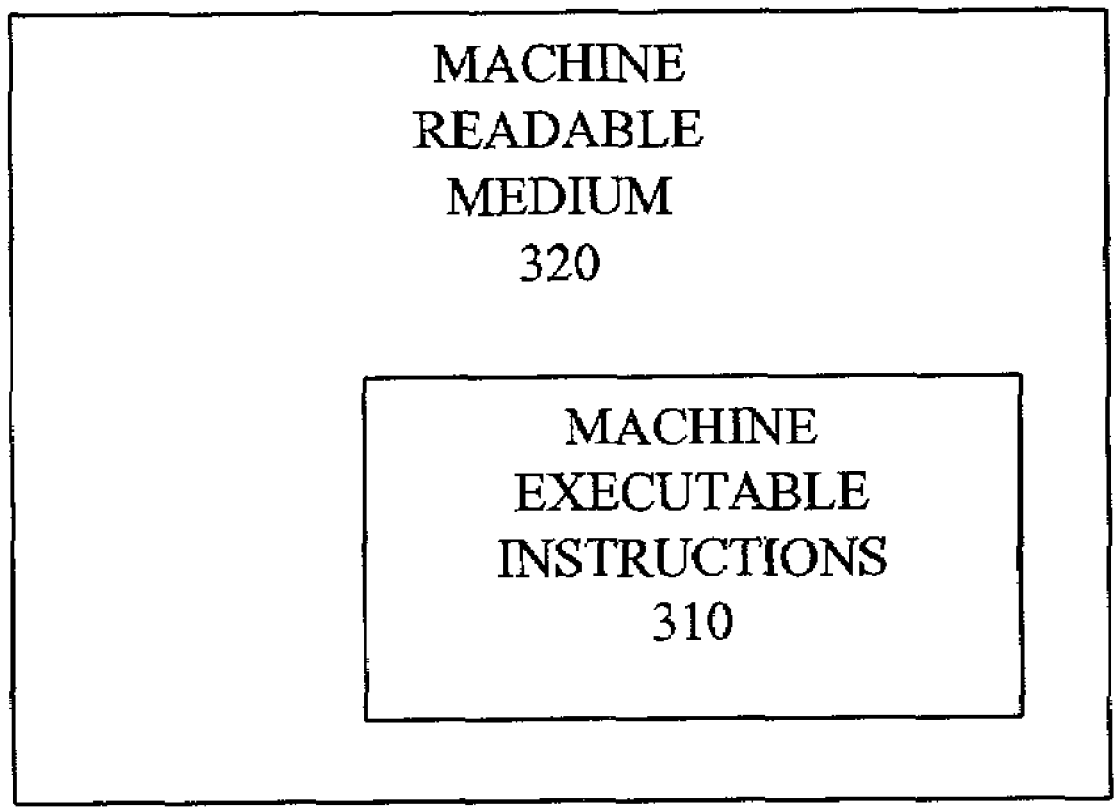
FIG. 3 illustrates one embodiment of a machine-readable medium to store executable instructions for a multi-domain simulation environment.

Alternately, as shown in FIG. 3, the software routines can be machine executable instructions 310 stored using any machine readable storage medium 320, such as a diskette, CD-ROM, magnetic tape, digital video or versatile disk (DVD), laser disk, ROM, Flash memory, etc. The series of instructions need not be stored locally, and could be received from a remote storage device, such as a server on a network, a CD ROM device, a floppy disk, etc., through, for instance, I/O device(s) 250 of FIG. 2.

From whatever source, the instructions may be copied from the storage device into temporary memory 220 and then accessed and executed by processor 210. In one implementation, these software routines are written in the C programming language. It is to be appreciated, however, that these routines may be implemented in any of a wide variety of programming languages.

In alternate embodiments, the present invention is implemented in discrete hardware or firmware. For example, one or more application specific integrated circuits (ASICs) could be programmed with one or more of the above described functions of the present invention. In another example, one or more functions of the present invention could be implemented in one or more ASICs on additional circuit boards and the circuit boards could be inserted into the computer(s) described above. In another example, field programmable gate arrays (FPGAs) or static programmable gate arrays (SPGA) could be used to implement one or more functions of the present invention. In yet another example, a combination of hardware and software could be used to implement one or more functions of the present invention.

Thus, synchronizing multiple simulation domains within an EDA simulation environment is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A method comprising:
   selectively activating and deactivating a plurality of particular simulation domains that each comprise at least one simulation model in a simulation environment such that a resolution and a performance for a circuit design being simulated is dynamically modified, wherein each of the plurality of particular simulation domains operates at the same time, and wherein each of the plurality of particular simulation domains operates at a different frequency; and
   said simulation environment comprising a plurality of simulation domains.

2. The method of claim 1 wherein the plurality of simulation domains comprises at least one of a software execution domain, a hardware simulation domain, and an abstract model simulation domain.

3. The method of claim 2 wherein the software execution domain comprises at least one of a native processor package, an instruction set simulator (ISS), and a programming language simulator to model software execution in one or more processors.

4. The method of claim 2 wherein the hardware simulation domain comprises at least one of a logic simulator and a programming language simulator.

5. The method of claim 4 wherein the logic simulator comprises one of a hardware description language (HDL) based simulator, a gate-level simulator, a simulation accelerator, a system simulator, a cycle simulator, and a programmable hardware emulator.

6. The method of claim 4 wherein the programming language simulator comprises at least one of a C programming language simulator, a C++ programming language simulator, a simulator using a C-based language, a simulator using a C++ based language, and a JAVA programming language simulator.

7. The method of claim 1 wherein each of the plurality of simulation domains comprises at least one model of a circuit element in the circuit design.

8. The method of claim 1 further comprising:
partitioning the circuit design into the plurality of simulation domains based on a partition criteria.

9. The method of claim 8 wherein the partition criteria comprises at least one of an abstraction level, a simulation type, and a function type.

10. The method of claim 9 wherein partitioning the circuit design based on the abstraction level partitions the circuit design into at least one of a pin-level domain, a bus-level domain, and a transaction-level domain.

11. The method of claim 9 wherein partitioning the circuit design based on the simulation type partitions the circuit design into at least one of a software execution domain, a logic simulator domain, and a programming language simulator domain.

12. The method of claim 9 wherein partitioning the circuit design based on the function type comprises:
identifying one or more functional elements in the circuit design that each have a particular level of operation independent from the other functional elements in the circuit design; and
defining a domain encompassing each identified functional element.

13. The method of claim 1 wherein each of the plurality of simulation domains provides a particular performance level and a particular resolution level, and wherein the plurality of particular simulation domains are selectively activated or deactivated during particular stages of simulation in combinations that either accelerate performance of the simulation environment or increase resolution of the simulation environment.

14. The method of claim 1 wherein selectively activating and deactivating the plurality of particular simulation domains comprises:
identifying a system state of the circuit design;
determining which of the plurality of simulation domains are to be active for the identified system state; and
advancing simulation time only in each activated simulation domain.

15. The method of claim 14 wherein determining which of the plurality of simulation domains are to be active for the identified system state comprises at least one of a centralized control, a transaction-based control, and a distributed control.

16. The method of claim 15 wherein the centralized control comprises:
receiving the system state from one or more of the plurality of simulation domains;
consulting system configuration information to determine which of the plurality of simulation domains correspond to the particular system state; and
instructing a centralized simulation clock to advance only for those domains corresponding to the particular system state.

17. The method of claim 15 wherein the system state compnses system addresses in the circuit design.

18. The method of claim 15 wherein the system state comprises a data transaction in the circuit design, said data transaction being configured with information identifying which of the plurality of simulation domains are to be active for the data transaction, and wherein the transaction-based control comprises:
sending a message to a centralized simulation clock as part of the data transaction, said message to instruct the centralized simulation clock with respect to which of the plurality of simulation domains are to be active for the data transaction.

19. The method of claim 15 wherein a predetermined simulation domain is configured with activation information identifying at least one particular system state for which the predetermined simulation domain is to be active, wherein identifying the system state comprises receiving a broadcast of the system state at the predetermined simulation domain, and wherein distributed control at the predetermined simulation domain comprises:
determining if the predetermined simulation domain is to be active for the identified system state based on the activation information; and
advancing an operation in the predetermined simulation domain.

20. A method comprising:
selectively activating and deactivating a plurality of particular simulation domains that each comprise at least one simulation model in a simulation environment such that a resolution and a performance for a circuit design being simulated is dynamically modified, wherein each of the plurality of particular simulation domains operates at the same time, and wherein each of the plurality of particular simulation domains operates at a different frequency, wherein selectively activating and deactivating the plurality of particular simulation domains comprises:
identifying a system state of the circuit design:
determining which of the plurality of simulation domains are to be active for the identified system state, wherein determining which of the plurality of simulation domains are to be active for the identified system state comprises at least one of a centralized control, a transaction-based control, and a distributed control: and
advancing simulation time only in each activated simulation domain:
wherein a predetermined simulation domain is configured with activation information identifying at least one particular system state for which the predetermined simulation domain is to be active, wherein identifying the system state comprises receiving a broadcast of the system state at the predetermined simulation domain, wherein the activation information further identifies an event for terminating operation of the predetermined simulation domain for the at least one particular system state and wherein distributed control at the predetermined simulation domain comprises:

determining if the predetermined simulation domain is to be active for the identified system state based on the activation information; and advancing an operation in the predetermined simulation domain: and said simulation environment comprising a plurality of simulation domains.

21. The method of claim 14 wherein determining which of the plurality of simulation domains are to be active for the identified system state depends on a plurality of control mechanisms, wherein each of the plurality of control mechanisms comprises a priority level, and wherein a higher priority control mechanism takes precedence over a lower priority control mechanism.

22. The method of claim 1 wherein the plurality of simulation domains comprise a hierarchical structure, and wherein selectively activating and deactivating the plurality of particular simulation domains is based on levels of the hierarchical structure.

23. The method of claim 1 further comprising:
identifying state information comprising a transfer from a first simulation model in the simulation environment, said transfer being directed to a second simulation model in a circuit design being simulated in the simulation environment;
receiving the identified state information from the first simulation model; and
making the identified state information available to the second simulation model without simulating the transfer in the circuit design.

24. The method of claim 23 wherein simulating the transfer from the first simulation model to the second simulation model in the circuit design comprises transferring the state information through at least one additional simulation model in the simulation environment.

25. The method of claim 23 wherein receiving the state information and making the state information available comprises:
storing the state information in a coherent state memory space that is part of the simulation environment and corresponds to an element in the circuit design being simulated, said coherent state memory space being accessible to both the first simulation model and the second simulation model.

26. The method of claim 25 wherein the coherent state memory space is accessible to a plurality of additional simulation models.

27. The method of claim 23 wherein receiving the state information and making the state information available comprises at least one of:
a virtual transfer path for use when a simulation model of a transfer path in the circuit design is not included in the simulation environment; and
a higher performance transfer path than the simulation model of the transfer path in the circuit design.

28. The method of claim 27 wherein the higher performance transfer path provides a lower level of resolution than the simulation model of the transfer path in the circuit design.

29. The method of claim 1 wherein the first simulation model and a second simulation model of the plurality of simulation models represent different versions of a same functionality in the circuit design.

30. The method of claim 29 further comprising:
simulating the circuit design using the first simulation model, said first simulation model to generate state information; and switching to simulate the circuit design using the second simulation model, said first simulation model to transfer the state information to the second simulation model prior to the second simulation model being used.

31. The method of claim 30 wherein the first simulation model and the second simulation model each have a particular level of performance and resolution, and wherein switching to the second simulation model is based on a change in a performance level and/or a resolution level desired at a different stage of simulation.

32. The method of claim 1 wherein a set of simulation models among a plurality of simulation models represent a same functionality in the circuit design, each of the set of simulation models having a particular level of performance and resolution, and each of the set of simulation models being used at different stages of simulation depending on a performance level and/or resolution level of the simulation.

33. The method of claim 25 wherein the simulation environment comprises a plurality of additional simulation models, each of the plurality of additional simulation models corresponding to one or more of a plurality of additional coherent state memory spaces, the method further comprising:
identifying additional state information comprising additional transfers among the plurality of additional simulation models in the simulation environment; and
storing the additional state information in ones of the plurality of additional coherent state memory spaces such that the additional state information is accessible to corresponding ones of the plurality of additional simulation models without simulating the additional transfers in the circuit design.

34. The method of claim 23 wherein both the first simulation model and the second simulation model are within a same simulation domain in the simulation environment.

35. The method of claim 23 wherein the first simulation model and the second simulation model are with different simulation domains in the simulation environment.

36. The method of claim 3 wherein the programming language simulator comprises at least one of a C programming language simulator, a C++ programming language simulator, a simulator using a C-based language, a simulator using a C++ based language, and a JAVA programming language simulator.

37. The method of claim 2 wherein the abstract model simulation domain comprises at least one of a hardware description language (HDL) simulator and a programming language simulator.

38. The method of claim 37 wherein the programming language simulator comprises at least one of a C programming language simulator, a C++ programming language simulator, a simulator using a C-based language, a simulator using a C++ based language, and a JAVA programming language simulator.

39. A machine readable storage medium having stored thereon machine readable instructions that when executed implement a method comprising:
selectively activating and deactivating a plurality of particular simulation domains that each comprise at least one simulation model in a simulation environment such that a resolution and a performance for a circuit design being simulated is dynamically modified, wherein each of the plurality of particular simulation domains operates at the same time, and wherein each of the plurality of particular simulation domains operates at a different frequency; and said simulation environment comprising a plurality of simulation domains.

40. The machine readable storage medium of claim 39, wherein the method further comprises partitioning the circuit design into the plurality of simulation domains based on a partition criteria.

* * * * *

UNITED STATES PATENT AND TRADEMARK OFFICE
CERTIFICATE OF CORRECTION

PATENT NO. : 7,260,517 B2  
APPLICATION NO. : 09/883838  
DATED : August 21, 2007  
INVENTOR(S) : Bailey et al.

Page 1 of 1

It is certified that error appears in the above-identified patent and that said Letters Patent is hereby corrected as shown below:

Column 14, line 8, "compnses" should read -- comprises --

Signed and Sealed this

Twenty Second Day of April, 2008

JON W. DUDAS  
*Director of the United States Patent and Trademark Office*